United States Patent Office 3,169,868

Patented Feb. 16, 1965

3,169,868

LIGHT SENSITIVE PHOTORESIST COMPOSITION

Douglas G. Borden, Rochester, N.Y., assignor to Eastman Kodak Company, Rochester, N.Y., a corporation of New Jersey No Drawing. Filed Apr. 16, 1962, Ser. No. 187,921
12 Claims. (Cl. 96—90)

This invention is related to light-sensitive film-forming compositions, and particularly to light-sensitive film-forming compositions containing a nonlight-sensitive polymer sensitized with a nonazide sensitizer and elements coated with these compositions.

It is well known in the art of photoresists to utilize coatings of materials such as bichromated shellac, albumin, etc., on various supports such as metal plates as photoresist elements. Upon light exposure, the exposed areas become insolubilized and will not be softened and washed off as the unexposed areas are upon solvent development. The relief image obtained in this manner may be dyed for use as copy of the original, it may be used for printing purposes, it may be used as a resist for metal etching purposes, etc.

Where necessary, polymers used for photoresist compositions have been sensitized by the addition of arylazides, for example, azidostyryl ketones, azidostyrylaryl azides, etc., and other sensitizers to increase the light sensitivity of these materials.

New sensitizers that will photoinsolubilize a large variety of soluble nonlight-sensitive polymeric binders are needed for producing new photoresist compositions.

It is, therefore, an object of my invention to provide a new class of photoresist compositions which are valuable for producing relief images that can be dyed, used for lithographic printing, metal etching applications, etc.

Another object is to provide a novel photoresist composition comprising a nonlight-sensitive, soluble polymer selected from a wide variety of these polymers, a heterocyclic nonazide sensitizer and a solvent.

Still other objects will become apparent from the following specification and claims.

These and other objects are accomplished by using the photoresist compositions made according to my invention. My photoresist composition comprises a solution of film-forming nonlight-sensitive polymer that is made light sensitive by adding certain heterocyclic nonazide compounds as sensitizers. Photoresist elements are made by coating my film-forming light-sensitive photoresist composition on a suitable support by any of the methods well known in the art.

The heterocyclic nonazide compounds derived from thioxanthone, phenothiazine or phenoxazine nuclei used to advantage as sensitizers include those represented by the formula:

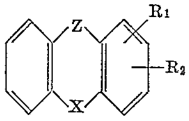

in which X represents a member selected from the class consisting of a sulfur atom and an oxygen atom; $R_1$ and $R_2$ each represent a hydrogen atom, a halogen atom, such as, chlorine, bromine, iodine, fluorine, an alkyl group, such as, methyl, ethyl, propyl, isopropyl, butyl, amyl, etc., an alkoxy group, such as, methoxy, ethoxy, propoxy, butoxy, amyloxy, etc., or together represent the nonmetallic atoms required to complete a benzene ring fused to the carbons in the first and second positions on the nucleus, fused to the carbons in the second and third positions of the nucleus or fused to the carbons at the third and fourth positions of the nucleus; Z represents a >C=S group or a >NR group; and R represents a hydrogen atom, a cyanoalkyl group, such as, cyanoethyl, cyanopropyl, cyanobutyl, etc., or a heterocyclic group, such as, a benzo[b]phenoxazine group attached at the carton in the seven position. Included are the following typical illustrative examples.

*Sensitizer 1*

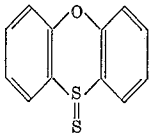

Thioxanthone

*Sensitizer 2*

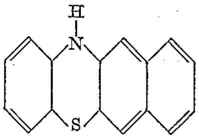

Benzo[b]phenothiazine

*Sensitizer 3*

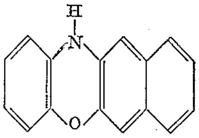

Benzo[b]phenoxazine

*Sensitizer 4*

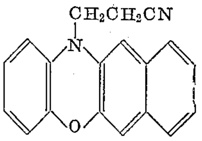

N-cyanoethyl benzo[b]phenoxazine

*Sensitizer 5*

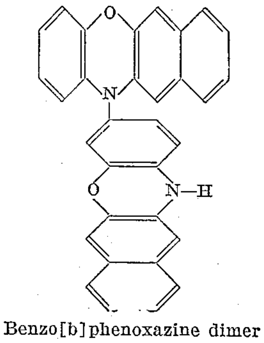

Benzo[b]phenoxazine dimer

*Sensitizer 6*

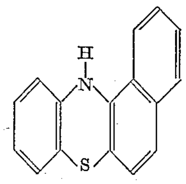

Benzo[a]phenothiazine

Other compounds that show some ability to sensitize nonlight-sensitive colloids include the following: acridizinium bromide, dithiooxamide, 2,5-difurfuralcyclopentanone, 2,5-divanillal cyclopentanone.

A wide variety of film-forming nonlight-sensitive soluble colloid binders are used to advantage in my photoresist compositions. These include water-soluble colloids such as gelatin, cellulose derivatives (e.g., ethylcellulose, cellulose ether phthalate, etc.), polyvinyl compounds (e.g., polyvinyl alcohol, poly(vinyl acetate), etc.), polyethylene oxide, etc.; aqueous solvent-soluble colloids such as copolymers of ethyl acrylate and acrylic acid, copolymers of butadiene and methacrylic acid, etc.; and organic solvent-soluble colloids such as polyvinyl compounds (e.g., poly(vinyl butyral), poly(vinyl chloride), poly(4-vinyl pyridine), etc.), polystyrene, polyvinylidene chloride, acrylic acid derivatives (e.g., copolymers of ethyl acrylate and acrylic acid, copolymers of butadiene and methacrylic acid, copolymers of methylacrylate and vinylidene chloride, terpolymers of acrylonitrile, vinylidene chloride and ethyl acrylate, etc., terpolymers of poly(vinyl chloride), vinyl acetate and maleic acid, copolymers of vinyl chloride-acetate, copolymers of styrene and butadiene, natural rubber, poly - cis - 1,4 - isoprene, alcohol-soluble nylon (made by the Du Pont Company, etc.).

Solvents that are used to advantage in making my photoresist compositions include water, aqueous solutions such as ammonia water, and any of the organic solvents commonly employed in the art for coating high polymer layers. Preferred organic solvents include the lower alcohols such as methanol, ethanol, propanol, etc., ketones such as cyclohexanone, 2-butanone, 4-methyl-2-pentanone, acetone, etc., dimethyl formamide, tetrahydrofuran, pyridine, benzene, toluene, etc., and mixtures of these. The choice of a specific solvent or solvent mixture will depend upon the sensitizers and colloid binder used.

The ratio of sensitizer to polymer can be varied over a wide range with the sensitizer making up from about 2% to about 67% by weight of the dried composition. Usually the range is from 2% to 50% and the preferred range is from 5% to 20% of sensitizer in the dried composition. The optimum amounts will depend upon the particular sensitizer and binders used and are determined by techniques well known in the art.

My film-forming light-sensitive photoresist compositions are coated on any of the support materials used conventionally for photoresist elements. These support materials include various polymeric materials, such as, polyester film base, cellulose acetate-propionate, cellulose acetate, the polycarbonates, etc., baryta coated paper, metal sheeting such as copper, aluminum, etc., metal sheeting laminated to nonconducting supports used for circuit boards, such as copper on a resin base, copper bonded to a fiber board base, etc., plastic sheeting or paper coated with an evaporated metal film, etc.

These supports can be coated in any of the conventional methods well known in the photoresist art. A particularly convenient method that is widely used is referred to as whirl coating.

The coated photoresist material is exposed to a light image and then developed by treating in the appropriate solvent selected from the solvents listed previously. In the development step, the unexposed areas of the photoresist coating are softened and washed off, leaving a resist image corresponding to the exposed areas. This resist image can be dyed in a photoresist dye-bath to make the image easier to inspect. If the photoresist image is on a metal support that is to be etched, the element is then treated with an etching bath for the particular metal. (A basic solution such as sodium hydroxide solution is used for etching aluminum, and an acidic solution such as ferric chloride is used for etching copper.)

My invention is further illustrated by the following representative examples, but it is to be understood that the invention is not to be limited to these examples.

*Example 1*

A 5% solution of Pliolite $S_7$, poly(styrene-butadiene) made by Goodyear Tire and Rubber Co., in benzene was sensitized with 0.25% thioxanthone and coated on aluminum. This coated material was exposed through a photographic negative to a General Electric Company sunlamp at 10 inches for 3 minutes. Following exposure, the element was developed in benzene and dyed in a photoresist dye solution to give a very good photoresist.

*Example 2*

A 2% solution of Pliolite $S_7$ in benzene-toluene sensitized with 0.2% benzo[b]phenoxazine was whirl-coated on aluminum and exposed through a photographic line negative to a sunlamp at 10 inches for 4 minutes. The exposed material was developed in benzene and dyed in a photoresist dye-bath to give a clear well defined image.

Similar results were obtained when benzo[a]phenoxazine was substituted for benzo[b]phenoxazine.

*Example 3*

A composition like that of Example 2 but sensitized with benzo[b]phenoxazine dimer was coated, exposed, and developed as in Example 2, gave good images. Another sample of the coated material was exposed in a spectrograph and developed. The wedge spectrogram produced showed this material had a spectral sensitivity in the range from 3100° to 4050° A.

*Example 4*

A composition like that made in Example 2 but sensitized with N-cyanoethyl benzo[b]phenoxazine was coated, exposed and developed as in Example 2 to give a good photoresist image.

*Example 5*

A whirl-coating was made as described in Example 2 but in which benzo[b]phenothiazine was used as the sensitizer. This material was exposed through a photographic image for 3 minutes to a sunlamp at 10 inches. When this element was developed and dyed as described previously, a well defined image was produced.

Similarly, other sensitizers of my invention are used advantageously to sensitize other film-forming nonlight-sensitive polymers and make useful photoresist compositions.

A print-out and photoresist element can be prepared by coating on copper sheeting a 15% by weight solution of 50% acetylated polyvinyl alcohol in pyridine sensitized with 4-quinolizone. Exposures of 1 minute through a line or half-tone negative to a sunlamp at ten inches will produce a print-out image. A 5- to 40-minute exposure is required to produce solubilization to pyridine in the image areas. The pyridine developed elements, rinsed in methanol and dried, were dyed in the background areas by treatment in photoresist dye baths. Photoresists made in this way will withstand 40 minutes of etching in 43° Baumé ferric chloride at 40° C. Immersion of an exposed, developed and dyed coating on copper in 40% caustic bath at 50% for 40 minutes followed by water washing caused the image areas to become dye-receptive and the background (or nonimage areas) to be dye-repellent.

My invention is still further illustrated by descriptions of or literature references to descriptions of the preparation of typical sensitizers.

Sensitizer 1 was prepared according to the method described in J. Chem. Soc., Trans. vol. 97, 1290 (1910).

Sensitizer 2 was prepared according to the method described in Ann., vol. 427, 294 (1922).

Sensitizer 3 was prepared by the method described in Ber., vol. 47, 3102 (1914).

Sensitizer 4 was prepared by heating a mixture of 30 g. of Sensitizer 3, 60 ml. of acrylonitrile, 250 ml. of acetonitrile, and 2.5 ml. of Triton B (Rohm and Haas), tetramethyl ammonium hydroxide, on a steam bath for 2 hours. After cooling, the product was collected by filtration and crystallized from aqueous acetone. The product, Sensitizer 4, M.P. 153° C., was obtained in an 86% yield.

Sensitizer 5 was prepared as follows. A suspension of 10 g. of Sensitizer 3 in 200 ml. of trichloropropane was heated to 80–90° C. with stirring, and 3 ml. of 30% hydrogen peroxide was added slowly. The mixture became purple in color, and after heating for one-half hour, a gray solid separated. The heating and stirring were continued for 1½ hours, the mixture chilled at −10° C. and the solid collected, washed with ethanol, ether and then dried to yield 10 g. of the dimer, M.P. 352–354° C.

Sensitizer 6 was prepared according to the method described in Ber., vol. 55, 2346 (1922).

My photoresist compositions are made by sensitizing a solution of a film-forming nonlight-sensitive polymer with certain heterocyclic nonazide compounds that are derived from thioxanthone, phenothiazine or phenoxazine nuclei. Coatings of these compositions on conventional supports provide a valuable class of photoresists for use in lithography, image formation, metal etching, etc.

The invention has been described in detail with particular reference to preferred embodiments thereof but it will be understood that variations and modifications can be effected within the spirit and scope of the invention as described hereinabove and as defined in the appended claims.

I claim:

1. A light-sensitive element consisting of a support coated with a layer comprising:
(1) poly(styrene-butadiene), and as the sole sensitizer
(2) thioxanthone.

2. A light-sensitive element consisting of a support coated with a layer comprising:
(1) poly(styrene-butadiene), and as the sole sensitizer
(2) benzo[b]phenothiazine.

3. A light-sensitive element consisting of a support coated with a layer comprising:
(1) poly(styrene-butadiene), and as the sole sensitizer
(2) benzo[b]phenoxazine.

4. A light-sensitive element consisting of a support coated with a layer comprising:
(1) poly(styrene-butadiene), and as the sole sensitizer
(2) N-cyanoethyl benzo[b]phenoxazine.

5. A light-sensitive element consisting of a support coated with a layer comprising:
(1) poly(styrene-butadiene), and as the sole sensitizer
(2) benzo[b]phenoxazine dimer.

6. A film-forming light-sensitive photoresist coating composition comprising:
(1) A polymer selected from the class consisting of gelatin, a neutral rubber, a poly-cis-1,4-isoprene, a cellulosic polymer, a polyethylene oxide and a vinyl polymer,
(2) As the sole photosensitizer for said polymer (1) at least one compound having the formula:

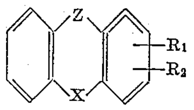

wherein X represents an atom selected from the class consisting of sulfur and oxygen; $R_1$ and $R_2$ each represents a member selected from the class consisting of the hydrogen atom, a halogen atom, an alkyl group, an alkoxy group, and together $R_1$ and $R_2$ represent the nonmetallic atoms required to complete a fused benzene ring; Z represents a member selected from the class consisting of the C=S group and a NR group; and R represents a member selected from the class consisting of the hydrogen atom, a cyanoalkyl group and a benzo[b]phenoxazine group, and
(3) A solvent for said polymer and said photosensitizer.

7. A film-forming light-sensitive composition of claim 6 in which the sensitizer is thioxanthone.

8. A film-forming light-sensitive composition of claim 6 in which the sensitizer is benzo[b]phenothiazine.

9. A film-forming light-sensitive composition of claim 6 in which the sensitizer is benzo[b]phenoxazine.

10. A film-forming light-sensitive composition of claim 6 in which the sensitizer is N-cyanoethyl benzo[b]phenoxazine.

11. A film-forming light-sensitive composition of claim 6 in which the sensitizer is benzo[b]phenoxazine dimer.

12. A light-sensitive photoresist element comprising a support coated with a layer comprising:
(1) A polymer selected from the class consisting of gelatin, a natural rubber, a poly-cis-1,4-isoprene, a cellulosic polymer, a polyethylene oxide and a vinyl polymer,
(2) As the sole photosensitizer for said polymer (1) at least one compound having the formula:

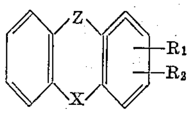

wherein X represents an atom selected from the class consisting of sulfur and oxygen; $R_1$ and $R_2$ represents a member selected from the class consisting of the hydrogen atom, a halogen atom, an alkyl group, an alkoxy group, and together $R_1$ and $R_2$ represent the nonmetallic atoms required to complete a fused benzene ring; Z represents a member selected from the class consisting of the C=S group and a NR group; and R represents a member selected from the class consisting of the hydrogen atom, a cyanoalkyl group and a benzo[b]phenoxazine group.

References Cited in the file of this patent

UNITED STATES PATENTS 2,449,980 Damschroder et al. ______ Sept. 28, 1948
2,789,052 Elliott ______________ Apr. 16, 1957
2,859,111 Werner ______________ Nov. 4, 1958
2,997,391 Murray et al. ___________ Aug. 22, 1961

UNITED STATES PATENT OFFICE

CERTIFICATE OF CORRECTION

Patent No. 3,169,868 February 16, 1965

Douglas G. Borden

It is hereby certified that error appears in the above numbered patent requiring correction and that the said Letters Patent should read as corrected below.

Column 2, lines 7 to 12, for that portion of the formula reading

read

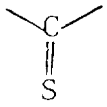

column 6, line 41, after "$R_2$" insert -- each --.

Signed and sealed this 12th day of April 1966.

(SEAL)
Attest:

ERNEST W. SWIDER
Attesting Officer

EDWARD J. BRENNER
Commissioner of Patents